United States Patent
Kim et al.

(10) Patent No.: US 9,997,581 B2
(45) Date of Patent: Jun. 12, 2018

(54) ORGANIC LIGHT-EMITTING DIODE DISPLAY HAVING HIGH APERTURE RATIO AND METHOD FOR MANUFACTURING THE SAME

(71) Applicant: LG Display Co., Ltd., Seoul (KR)

(72) Inventors: Yongmin Kim, Gyeonggi-do (KR); Jeongoh Kim, Gyeonggi-do (KR); Jungsun Beak, Gyeonggi-do (KR); Kyoungjin Nam, Gyeonggi-do (KR); Jeonggi Yun, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 1 day.

(21) Appl. No.: 14/939,079

(22) Filed: Nov. 12, 2015

(65) Prior Publication Data

US 2016/0133682 A1 May 12, 2016

(30) Foreign Application Priority Data

Nov. 12, 2014 (KR) ........................ 10-2014-0156625

(51) Int. Cl.
*H01L 27/32* (2006.01)
*H01L 51/52* (2006.01)
(Continued)

(52) U.S. Cl.
CPC ...... *H01L 27/3265* (2013.01); *H01L 27/3248* (2013.01); *H01L 27/3258* (2013.01);
(Continued)

(58) Field of Classification Search
CPC ............ H01L 27/3265; H01L 27/3248; H01L 27/3262; H01L 51/56; H01L 27/3258;
(Continued)

(56) References Cited

U.S. PATENT DOCUMENTS 9,871,087 B2 * 1/2018 Yun ..................... H01L 27/3272
2006/0006540 A1 1/2006 Park et al.
(Continued)

FOREIGN PATENT DOCUMENTS

CN 1761049 A 4/2006
CN 103022080 A 4/2013
(Continued)

OTHER PUBLICATIONS

Communication dated Apr. 8, 2016 from the European Patent Office in counterpart European Application No. 15194213.3.
The First Office Action dated Dec. 28, 2017 from The State Intellectual Property Office of the People's Republic of China in related Chinese application No. 201510768045.8.

*Primary Examiner* — Hoang-Quan Ho
(74) *Attorney, Agent, or Firm* — Morgan, Lewis & Bockius LLP

(57) ABSTRACT

An organic light-emitting diode display includes a substrate in which an emission area and a non-emission area are defined; a thin film transistor disposed in the non-emission area on the substrate; passivation layer disposed on the thin film transistor; a first storage capacitor electrode and a second storage capacitor electrode superposed thereon, having the passivation layer interposed therebetween, in the emission area; an overcoat layer disposed on the second storage capacitor electrode; and an anode disposed on the overcoat layer, coming into contact with one side of the second storage capacitor electrode through an overcoat layer contact hole penetrating the overcoat layer and, coming into contact with part of the thin film transistor through a passivation layer contact hole disposed in the overcoat layer contact hole and penetrating the passivation layer.

11 Claims, 17 Drawing Sheets

(51) Int. Cl.
*H01L 51/56* (2006.01)
*H01L 27/12* (2006.01)

(52) U.S. Cl.
CPC ...... *H01L 27/3262* (2013.01); *H01L 51/5206* (2013.01); *H01L 51/5253* (2013.01); *H01L 51/56* (2013.01); *H01L 27/124* (2013.01); *H01L 27/1248* (2013.01); *H01L 27/1255* (2013.01); *H01L 27/1259* (2013.01); *H01L 27/322* (2013.01); *H01L 27/3272* (2013.01); *H01L 2227/323* (2013.01)

(58) Field of Classification Search
CPC ............. H01L 51/5253; H01L 51/5206; H01L 27/3272; H01L 27/322; H01L 2227/323; H01L 27/1259; H01L 27/1255; H01L 27/1248
See application file for complete search history.

(56) References Cited

U.S. PATENT DOCUMENTS

| | | |
|---|---|---|
| 2006/0050192 A1 | 3/2006 | Cho et al. |
| 2009/0068773 A1 | 3/2009 | Lai et al. |
| 2011/0147757 A1* | 6/2011 | Kim .................. H01L 29/78633 257/71 |
| 2011/0266545 A1* | 11/2011 | Won ...................... H01L 27/124 257/59 |
| 2014/0159010 A1 | 6/2014 | Song et al. |
| 2015/0115259 A1* | 4/2015 | Yamazaki ........... H01L 27/1225 257/43 |
| 2015/0144910 A1 | 5/2015 | Beak et al. |

FOREIGN PATENT DOCUMENTS

| | | |
|---|---|---|
| KR | 1020050117302 | 12/2005 |
| TW | 200726310 A | 7/2007 |
| WO | 2008/093583 A1 | 8/2008 |

* cited by examiner

ORGANIC LIGHT-EMITTING DIODE DISPLAY HAVING HIGH APERTURE RATIO AND METHOD FOR MANUFACTURING THE SAME

This application claims the benefit of Korean Patent Application No. 10-2014-0156625 filed on Nov. 12, 2014, which is hereby incorporated herein by reference for all purposes as if fully set forth herein.

BACKGROUND OF THE INVENTION

Field of the Invention

The present invention relates to a display device, and more particularly to an organic light-emitting diode display and a method for manufacturing the same.

Discussion of the Related Art

Recently, a variety of flat panel displays having reduced weight and volume, compared to cathode ray tubes, has been developed. Such flat panel displays include liquid crystal displays, field emission displays (FEDs), plasma display panels (PDPs), electroluminescent devices (ELs) and the like.

ELs are classified into an inorganic EL and an organic light-emitting diode display and are self-emissive devices having the advantages of high response speed, luminous efficacy and luminance and a wide viewing angle.

FIG. 1 illustrates a structure of an organic light-emitting diode. As show in FIG. 1, the organic light-emitting diode includes an organic electroluminescent compound layer, a cathode and an anode opposite to each other having the organic electroluminescent compound layer interposed therebetween. The organic electroluminescent compound layer includes a hole injection layer (HIL), a hole transport layer (HTL), an emission layer (EML), an electron transport layer (ETL) and an electron injection layer (EIL).

The organic light-emitting diode emits light according to energy from excitons generated through a process in which holes and electrons injected into the anode and the cathode are recombined in the EML. An organic light-emitting diode display displays images by electrically controlling the quantity of light generated in the EML of the organic light-emitting diode as shown in FIG. 1.

Organic light-emitting diode displays (OLEDDs) using the characteristics of the organic light-emitting diode which is an electroluminescent device are classified into a passive matrix type organic light-emitting diode display (PMOLED) and an active matrix type organic light-emitting diode display (AMOLED).

The AMOLED displays images by controlling current flowing through organic light-emitting diodes using a thin film transistor (referred to as TFT hereinafter).

FIG. 2 is an equivalent circuit diagram illustrating a structure of one pixel of an organic light-emitting diode display, FIG. 3 is a plan view of the structure of one pixel of the organic light-emitting diode display and FIG. 4 is a cross-sectional view illustrating the structure of the related art organic light-emitting diode display, taken along line I-I' of FIG. 3.

Referring to FIGS. 2 and 3, an AMOLED includes a switching TFT (TFT) ST, a driving TFT DT connected to the switching TFT ST and an organic light-emitting diode OLED in contact with the driving TFT DT.

The switching TFT ST is formed at an intersection of a scan line SL and a data line DL and serves to select a pixel. The switching TFT ST includes a gate electrode SG, a semiconductor layer SA, a source electrode SS and a drain electrode SD. The driving TFT DT drives an organic light-emitting diode OLED of a pixel selected by the switching TFT ST. The driving TFT DT includes a gate electrode DG connected to the drain electrode SD of the switching TFT ST, a semiconductor layer DA, a source electrode DS connected to a driving current line VDD and a drain electrode DD. The drain electrode DD of the driving TFT DT is connected to an anode ANO of the organic light-emitting diode OLED.

More specifically, referring to FIG. 4, the gate electrodes SG and DG of the switching TFT ST and the driving TFT DT are formed on a substrate SUB of the AMOLED. A gate insulating layer GI is formed on the gate electrodes SG and DG. The semiconductor layers SA and DA are formed on portions of the gate insulating layer GI, which correspond to the gate electrodes SG and DG. The source electrode SS and the drain electrode SD are formed on the semiconductor layer SA, opposite to each other having a predetermined gap provided therebetween. The source electrode DS and the drain electrode DD are formed on the semiconductor layer DA, opposite to each other having a predetermined gap provided therebetween. The drain electrode SD of the switching TFT ST is connected to the gate electrode DG of the driving TFT DT via a contact hole formed in the gate insulating layer GI. A passivation layer PAS is formed on the overall surface of the substrate so as to cover the switching TFT ST and the driving TFT DT having the aforementioned structure.

When the semiconductor layers SA and DA are formed of an oxide semiconductor material, high resolution and fast driving can be achieved in a large TFT substrate having large charging capacity due to high mobility. However, it is desirable that the oxide semiconductor material layers further include etch stoppers SE and DE for protecting the surface thereof from etchant in order to ensure device stability. Specifically, the etch stoppers SE and DE are formed so as to prevent the semiconductor layers SA and DA from being back-etched due to an etchant contacting the exposed surfaces of the semiconductor layers SA and DA, which correspond to the gaps between the source electrodes SS and DS and the drain electrodes SD and DD.

A color filter CF is formed in a region corresponding to the anode ANO which will be formed later. The color filter CF is preferably formed to occupy a wide area if possible. For example, the color filter CF is formed such that the color filter CF is superposed on a wide area including the data line DL, driving current line VDD and scan line SL. The substrate on which the color filter CF has been formed has an uneven surface and many stepped portions since a lot of components have been formed thereon. Accordingly, an overcoat layer OC is formed on the overall surface of the substrate in order to planarize the surface of the substrate.

Subsequently, the anode ANOP of the OLED is formed on the overcoat layer OC. Here, the anode ANO is connected to the drain electrode DD of the driving TFT DT via a contact hole formed in the overcoat layer OC and the passivation layer PAS.

A bank pattern BN for defining a pixel region is formed on the switching TFT ST, the driving TFT DT and the interconnection lines DL, SL and VDD formed on the substrate on which the anode ANO is formed.

The anode ANO exposed through the bank pattern BN becomes an emission area. An organic emission layer OLE and a cathode layer CAT are sequentially formed on the anode ANO exposed through the bank pattern BN. When the organic emission layer OLE is formed of an organic material emitting white light, the organic emission layer OLE expresses a color assigned to each pixel according to the color filter CF located under the organic emission layer OLE. The organic light-emitting diode display having the structure as shown in FIG. 4 is a bottom emission display which emits light downward.

In such a bottom emission organic light-emitting diode display, a storage capacitor STG is formed in a space in which the anode ANO is superposed on the gate electrode DG of the driving TFT DT. The organic light-emitting diode display displays image information by driving organic light-emitting diodes. Here, a considerably large amount of energy is necessary to drive the organic light-emitting diodes. Accordingly, a large-capacity storage capacitor is needed in order to correctly display image information having rapidly changing data values, such as video.

To secure a storage capacitor having sufficient capacity, a storage capacitor electrode needs to have a sufficiently large area. In the bottom emission organic light-emitting diode display, a light emitting area, that is, an aperture ratio, decreases as the storage capacitor area increases. In a top emission organic light-emitting diode display, the storage capacitor can be formed under the emission area and thus the aperture ratio does not decrease even when a large-area storage capacitor is designed. However, the area of the storage capacitor is directly related to aperture ratio decrease in the bottom emission organic light-emitting diode display.

To manufacture such an organic light-emitting diode display, a photolithography process using a photo-mask is performed multiple times. Each mask process includes cleaning, exposure, development, etching and the like. When the number of mask processes increases, time and costs for manufacturing the organic light-emitting diode display and a defect generation rate increase, decreasing production yield. Accordingly, it is necessary to reduce the number of mask processes in order to decrease manufacturing costs and improve production yield and production efficiency.

SUMMARY OF THE INVENTION

Accordingly, the present invention is directed to aorganic light-emitting diode display and a method for manufacturing the same that substantially obviate one or more of the problems due to limitations and disadvantages of the related art.

An object of the present invention is to provide an organic light-emitting diode display and a method for manufacturing the same for securing a storage capacitor having sufficient capacity without decreasing an aperture ratio by forming the storage capacitor in an emission area using a transparent storage capacitor electrode.

Another object of the present invention is to provide an organic light-emitting diode display and a method for manufacturing the same for simplifying a manufacturing process by reducing the number of mask processes.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic light-emitting diode display comprises a substrate in which an emission area and a non-emission area are defined; a thin film transistor disposed in the non-emission area on the substrate; passivation layer disposed on the thin film transistor; a first storage capacitor electrode and a second storage capacitor electrode superposed thereon, having the passivation layer interposed therebetween, in the emission area; an overcoat layer disposed on the second storage capacitor electrode; and an anode disposed on the overcoat layer, coming into contact with one side of the second storage capacitor electrode through an overcoat layer contact hole penetrating the overcoat layer and, coming into contact with part of the thin film transistor through a passivation layer contact hole disposed in the overcoat layer contact hole and penetrating the passivation layer.

In another aspect, a method for manufacturing an organic light-emitting diode display comprises defining an emission area and a non-emission area on a substrate; forming a thin film transistor in the non-emission area and forming a first storage capacitor electrode in the emission area on the substrate; forming a passivation layer on the overall surface of the substrate on which the thin film transistor and the first storage capacitor electrode are formed; forming a second storage capacitor electrode in the emission area on the passivation layer; coating an overcoat layer comprising a photosensitive insulating material on the overall surface of the substrate on which the first storage capacitor electrode is formed; forming a passivation contact hole for exposing part of the thin film transistor by patterning the overcoat layer and the passivation layer and forming an overcoat layer contact hole for exposing one side of the second storage capacitor electrode and the passivation layer contact hole by asking the overcoat layer; and forming an anode coming into contact with part of the thin film transistor through the passivation layer contact hole and, simultaneously, coming into contact with one side of the second storage capacitor electrode through the overcoat layer contact hole, on the overcoat layer.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention.

First Embodiment

Figure 1:
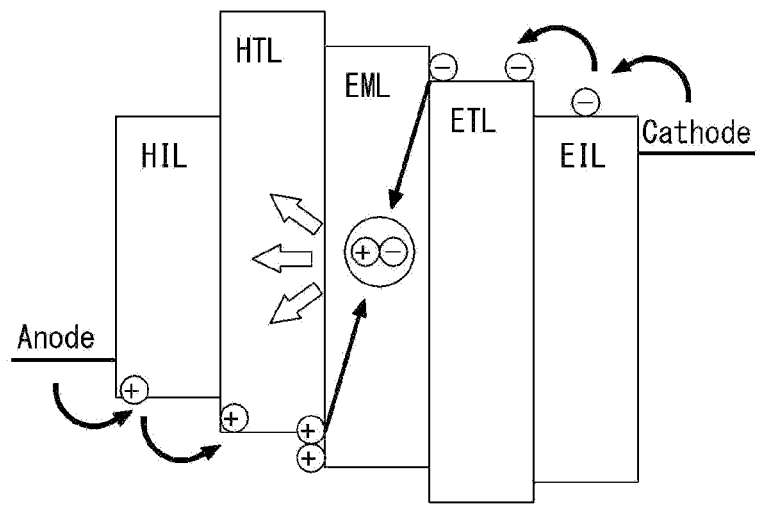
FIG. 1 illustrates a related art organic light-emitting diode display.
Figure 2:
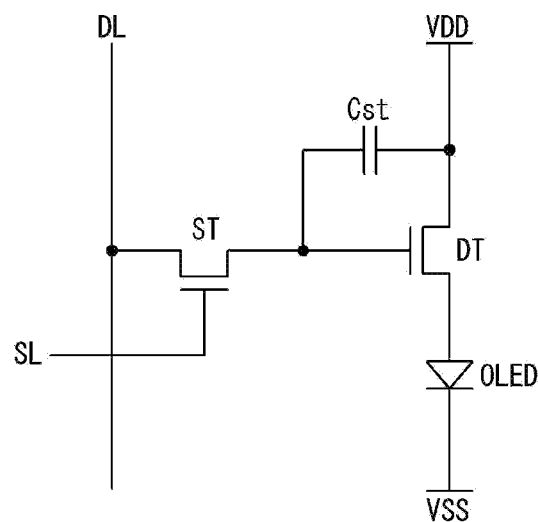
FIG. 2 is an equivalent circuit diagram illustrating a structure of one pixel of the related art organic light-emitting diode display.
Figure 3:
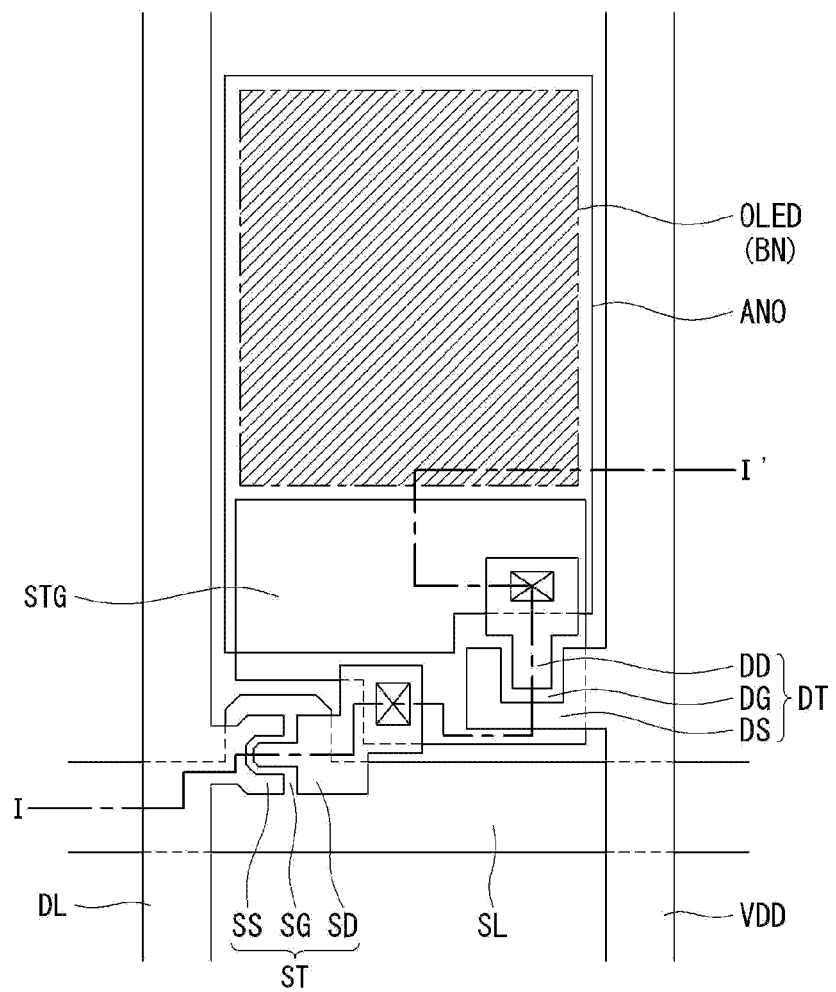
FIG. 3 is a plan view illustrating the structure of one pixel of the related art organic light-emitting diode display.
Figure 4:
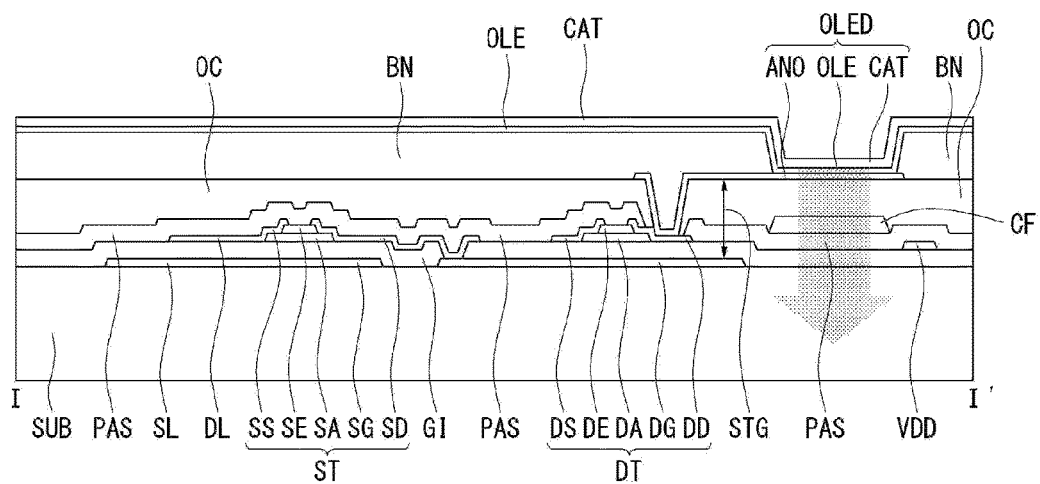
FIG. 4 is a cross-sectional view illustrating the structure of one pixel of the related art organic light-emitting diode display, taken along line I-I' of FIG. 3.
Figure 5:
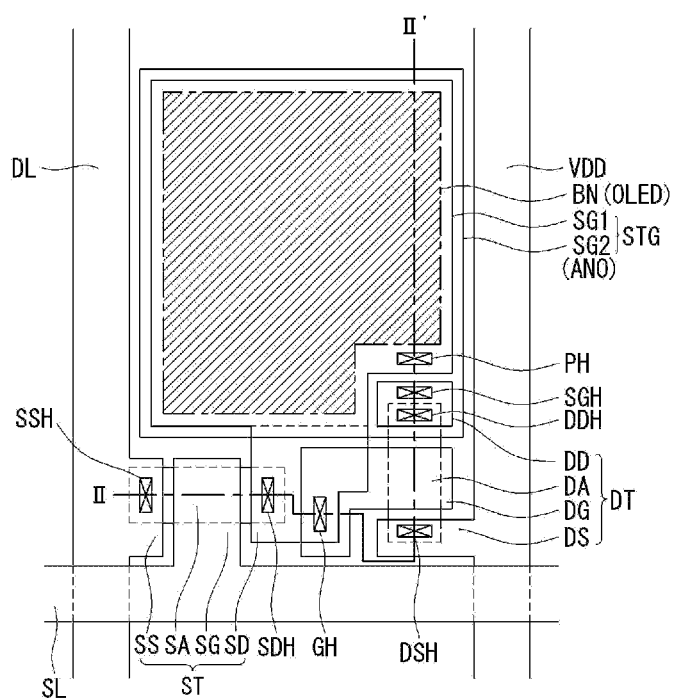
FIG. 5 is a plan view illustrating a structure of an organic light-emitting diode display according to a first example embodiment of the present invention.

A description will be given of an organic light-emitting diode display according to a first example embodiment of the present invention with reference to FIGS. 5 and 6. FIG. 5 is a plan view illustrating a structure of an organic light-emitting diode display according to the first example embodiment of the present invention and FIG. 6 is a cross-sectional view illustrating the structure of the organic light-emitting diode display according to the first example embodiment of the present invention, taken along line II-II' of FIG. 5.

Figure 6:
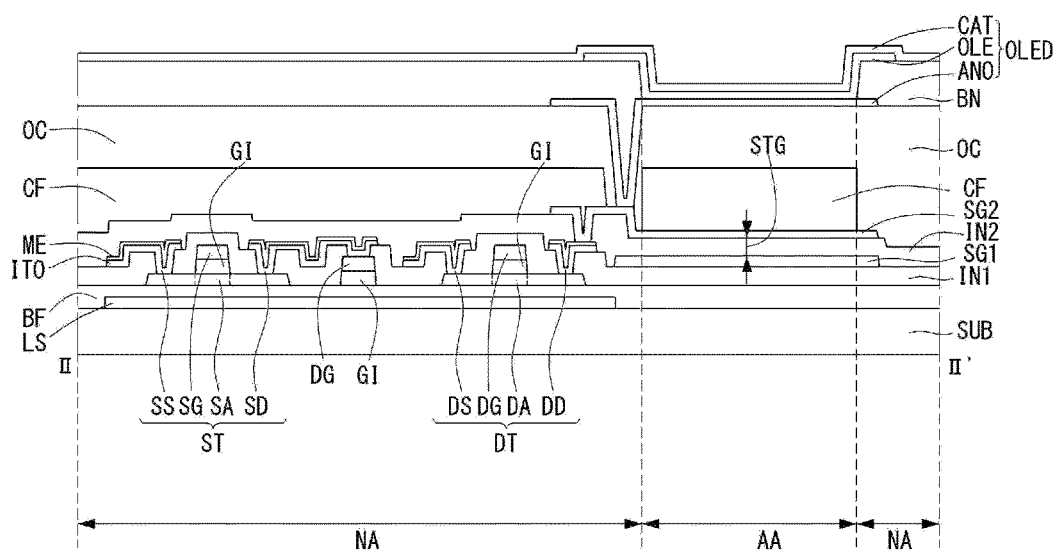
FIG. 6 is a cross-sectional view illustrating the structure of the organic light-emitting diode display according to the first example embodiment of the present invention, taken along line II-II' of FIG. 5.

Referring to FIGS. 5 and 6, the organic light-emitting diode display according to the first example embodiment of the present invention includes a substrate SUB in which an emission area AA and a non-emission area NA are defined, a switching TFT ST, a driving TFT DT connected to the switching TFT ST, a second storage capacitor electrode SG2 in contact with the driving TFT DT, a storage capacitor STG formed by a first storage capacitor electrode SG1 and the second storage capacitor electrode SG2 superposed thereon, and an organic light-emitting diode OLED connected to the driving TFT DT through the second storage capacitor electrode SG2. The storage capacitor STG and the organic light-emitting diode OLED are formed in the emission area AA and the TFTs ST and DT or interconnection lines SL, DL and VDD are formed in the non-emission area NA.

Scan lines SL and data lines DL are formed on the substrate SUB in a matrix form so as to define pixels. The switching TFT ST is formed at an intersection of a scan line SL and a data line DL and serves to select a pixel. The switching TFT ST includes a switching gate electrode SG, a channel layer SA, a switching source electrode SS and a switching drain electrode SD. The switching gate electrode SG is connected to the scan line SL and the switching source electrode SS is branched from the data line DL.

The driving TFT DT includes a driving gate electrode DG, a channel layer DA, a driving source electrode DS and a driving drain electrode DD. The driving gate electrode DG is connected to the switching drain electrode SD and the driving source electrode DS is branched from the driving current line VDD.

A passivation layer IN2 is formed to cover the source electrodes SS and DS and the drain electrodes SD and DD of the TFTs ST and DT while exposing part of the driving drain electrode DD. The second storage capacitor electrode SG2 is formed on the passivation layer IN2 so as to come into contact with part of the driving drain electrode DD. Here, the second storage capacitor electrode SG2 is superposed on the first storage capacitor electrode SG1, which is formed when the source electrodes SS and DS and the drain electrodes SD and DD of the TFTs ST and DT are formed, having the passivation layer IN2 interposed therebetween so as to form the storage capacitor STG.

Since the storage capacitor STG is formed in such a manner that the second storage capacitor electrode SG2 formed of a transparent conductive material is superposed on the first storage capacitor electrode SG1 formed of a transparent conductive material, the storage capacitor STG can have a large area without reducing the aperture ratio in the emission area AA. Accordingly, the organic light-emitting diode display according to the first example embodiment of the present invention can secure the storage capacitor STG having sufficient capacity.

Color filters CF may be formed on the second storage capacitor electrode SG2 in the emission area AA such that the color filters CF respectively correspond to pixel regions. Here, red, green and blue color filters CF may be sequentially disposed and the color filters CF may further include a white color filter CF. Red and/or green color filters CF may be extended and formed on the portion in which the TFTs ST and DT are formed in the pixel region so as to cover the TFTs ST and DT.

An overcoat layer OC, which exposes part of the second storage capacitor electrode SG2, is formed on the overall surface of the substrate SUB on which the color filters CF are formed. The overcoat layer OC is coated on the overall surface of the substrate SUB in order to planarize the surface of the substrate SUB on which the color filters CF are formed.

An anode ANO is formed on the overcoat layer OC to come into contact with the second storage capacitor electrode SG2. The anode ANO is electrically connected to the drain electrode DD of the driving TFT through the second storage capacitor electrode SG2.

A bank BN, which exposes part of the anode ANO, is formed on the anode ANO. An organic emission layer OLE is formed on part of the bank BN and the exposed portion of the anode ANO, and a cathode CAT is formed on the organic emission layer OLE so as to cover the organic emission layer OLE. In this manner, an organic light-emitting diode OLED including the anode ANO, the organic emission layer OLE and the cathode CAT is completed.

A description will be given of a process of manufacturing the organic light-emitting diode display according to the first example embodiment of the present invention with reference to FIGS. 7A to 7J. Characteristics of the organic light-emitting diode display according to the first example embodiment of the present invention are described in more detail through the manufacturing process. FIGS. 7A to 7J are cross-sectional views illustrating a method for manufacturing the organic light-emitting diode display according to the first example embodiment of the present invention.

Figure 7A:
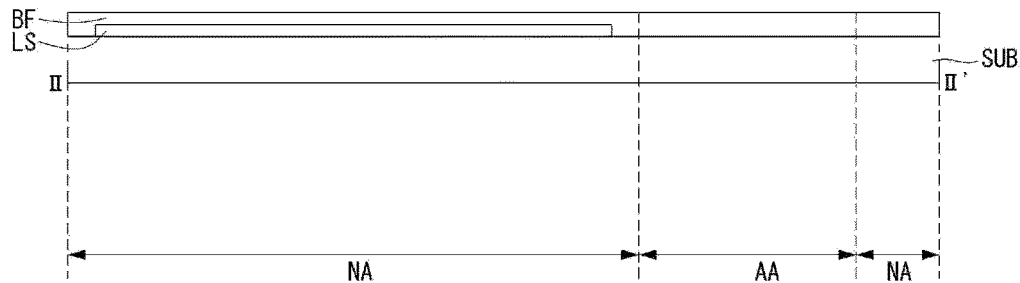
FIGS. 7A to 7J are cross-sectional views illustrating a method for manufacturing the organic light-emitting diode display according to the first example embodiment of the present invention.

Referring to FIG. 7A, an opaque light shielding material is coated on the overall surface of the substrate SUB and patterned through a first mask process to form a light shielding layer LS. It is desirable to form the light shielding layer LS such that semiconductor layers, particularly, channel regions of the TFTs, which will be formed later, are disposed on the light shielding layer LS. The light shielding layer LS serves to protect oxide semiconductor elements from external light. An insulating material is coated on the overall surface of the substrate SUB on which the light shielding layer LS is formed so as to form a buffer layer BF.

Figure 7B:
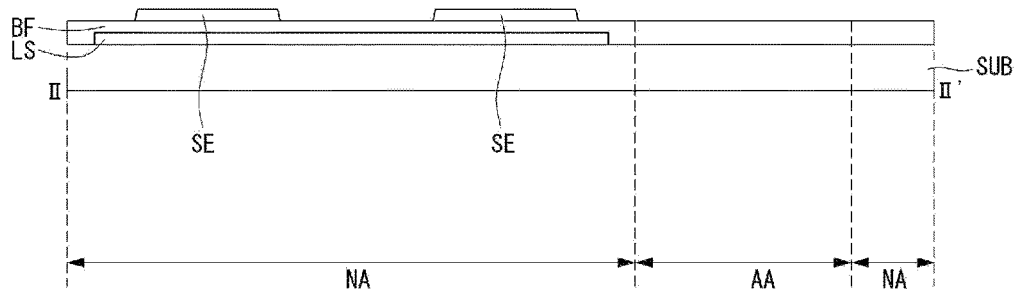

Referring to FIG. 7B, a semiconductor material is coated on the overall surface of the substrate SUB on which the buffer layer BF is formed. The semiconductor material may include an oxide semiconductor material such as indium gallium zinc oxide (IGZO). The semiconductor material layer is patterned through a second mask process to form semiconductor layers SE.

Figure 7C:
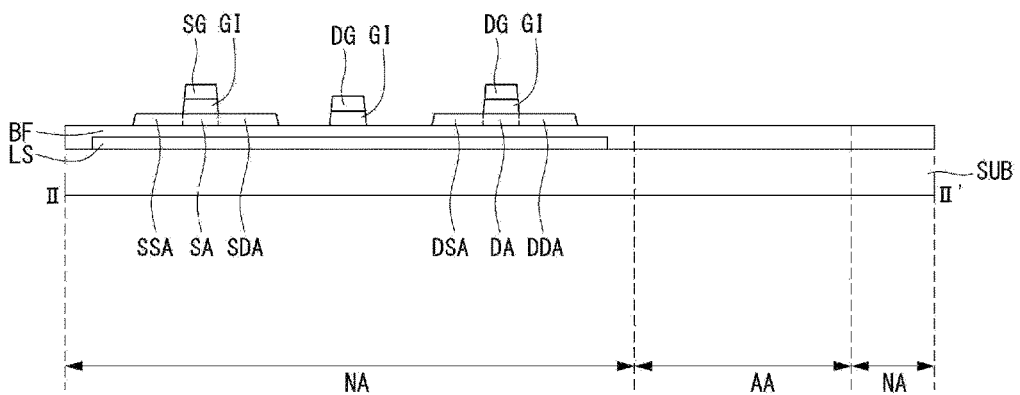

Referring to FIG. 7C, an insulating material and a metal material are sequentially coated on the overall surface of the substrate SUB on which the semiconductor layers SE are formed and simultaneously patterned through a third mask process to form a gate insulating layer GI and the gate electrodes SG and DG superposed thereon. The gate electrodes SG and DG are preferably formed such that the gate electrodes SG and DG are disposed on the center regions of the semiconductor layers SE while exposing both sides of the semiconductor layers SE. The center regions of the semiconductor layers SE are respectively defined as a channel layer SA of the switching TFT and a channel layer DA of the driving TFT. The exposed portions of the semiconductor layers SE become source regions SSA and DSA and drain regions SDA and DDA respectively coming into contact with the source electrodes and the drain electrodes of the switching TFT and the driving TFT. When the semiconductor material is an oxide semiconductor material, the source regions SSA and DSA and the drain regions SDA and DDA may be conductorized through a plasma treatment process.

Figure 7D:
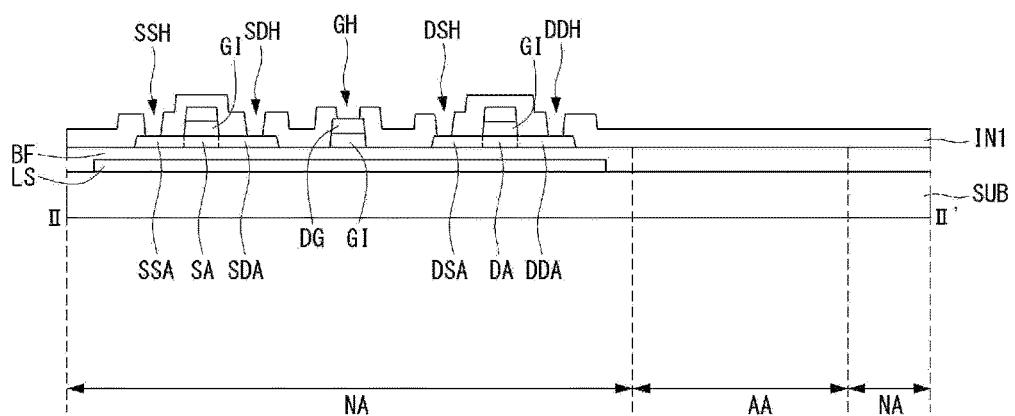

Referring to FIG. 7D, an insulating material is coated on the overall surface of the substrate SUB on which the gate electrodes SG and DG are formed so as to form an interlevel insulating layer IN1. The interlevel insulating layer IN1 is patterned through a fourth mask process to form contact holes SSH and DSH for exposing the source regions SSA and DSA of the semiconductor layers and contact holes SDH and DDH for exposing the drain electrodes SDA and DDA of the semiconductor layers. Here, a gate contact hole GH for exposing part of the gate electrode DG of the driving TFT is simultaneously formed.

Figure 7E:
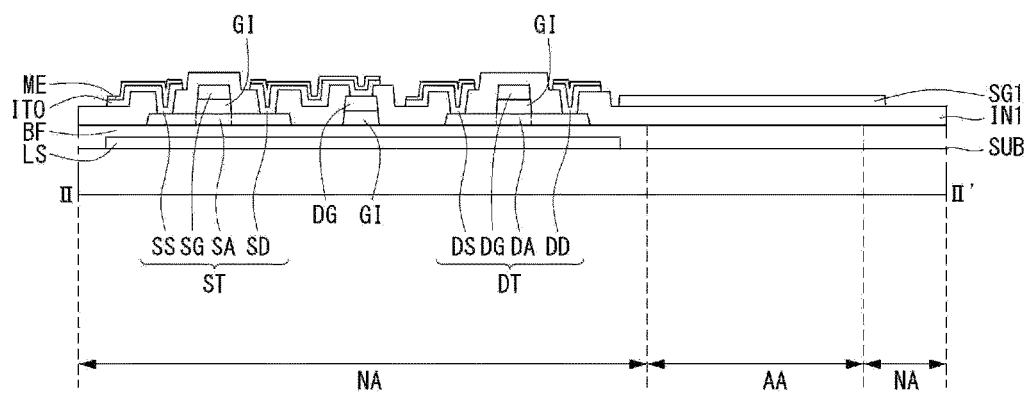

Referring to FIG. 7E, a transparent conductive material and a metal material are sequentially coated on the interlevel insulating layer IN1 in which the contact holes are formed. The transparent conductive material may be indium tin oxide, indium zinc oxide, indium tin zinc oxide or the like. The transparent conductive material layer and the metal material layer are patterned through a fifth mask process to form the source electrode SS and the drain electrode SD of the switching TFT ST and the source electrode DS and the drain electrode DD of the driving TFT DT. The first storage capacitor electrode SG1 is formed of the transparent conductive material in the emission area AA. Here, the drain electrode SD of the switching TFT is connected to the gate electrode DG of the driving TFT.

The fifth mask process is performed using a half-tone mask. By using the half-tone mask, the source electrode SS and the drain electrode SD of the switching TFT ST and the source electrode DS and the drain electrode DD of the driving TFT DT are formed of a double layer including the transparent conductor layer ITO and the metal material ME, and the first storage capacitor electrode SG1 is formed of a single layer including only the transparent conductive layer ITO. While the source electrodes SS and DS and the drain electrodes SD and DD of the TFTs ST and DT may be formed of a single layer including only the transparent conductive material ITO, it is desirable that the source electrodes SS and DS and the drain electrodes SD and DD be formed of a double layer including the laminated transparent conductive material ITO and metal material ME, considering that the transparent conductive material ITO has high sheet resistance.

Figure 7F:
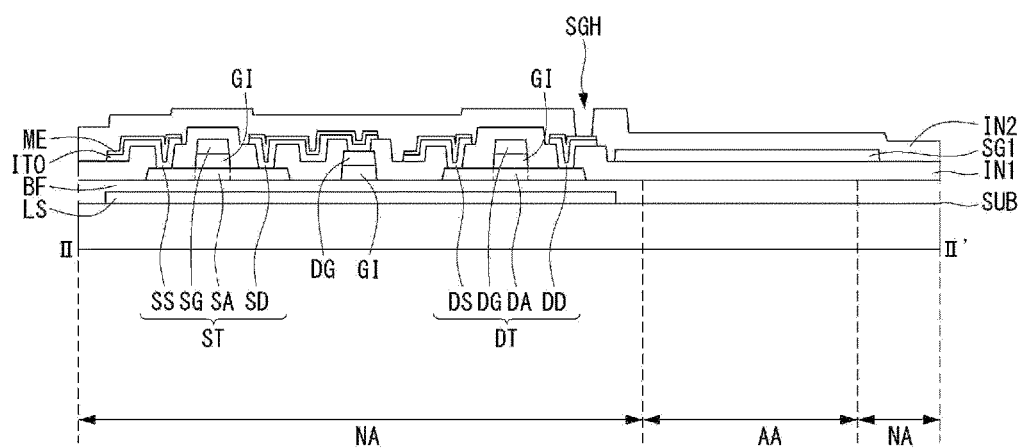

Referring to FIG. 7F, an insulating material is coated on the overall surface of the substrate SUB on which the TFTs ST and DT are formed so as to form a passivation layer IN2. The passivation layer IN2 is patterned through a sixth mask process to form a storage capacitor contact hole SGH.

Figure 7G:
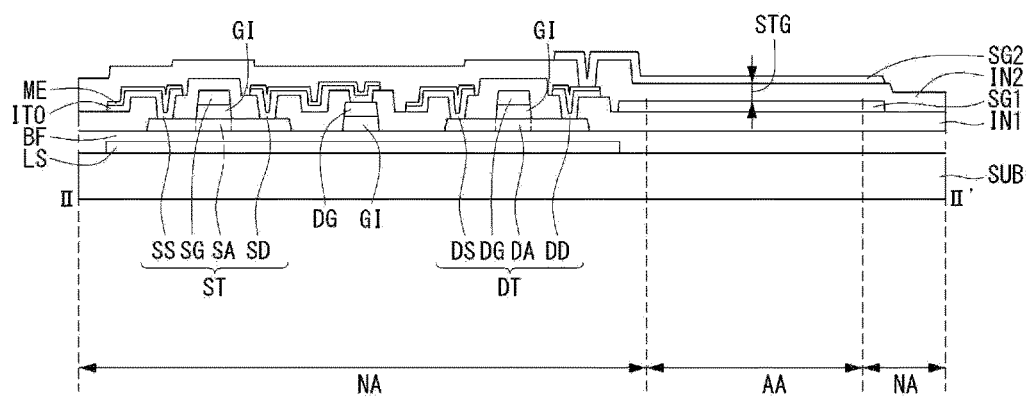

Referring to FIG. 7G, a transparent conductive material is coated on the overall surface of the substrate SUB on which the storage capacitor contact hole SGH is formed and patterned through a seventh mask process to form the second storage capacitor electrode SG2. It is desirable that the second storage capacitor electrode SG2 be formed to be superposed on the first storage capacitor electrode SG1. The second storage capacitor electrode SG2 comes into contact with the drain electrode DD of the driving TFT DT via the storage capacitor contact hole SGH.

Here, the second storage capacitor electrode SG2 is formed on the first storage capacitor electrode SG1 having the passivation layer IN2 interposed therebetween in the emission area AA so as to form the storage capacitor STG. Accordingly, the first and second storage capacitor electrodes SG1 and SG2 can be formed in the entire emission area AA without decreasing the aperture ratio of the organic light-emitting diode display according to the first example embodiment of the present invention since the first and second storage capacitor electrodes SG1 and SG2 are formed of the transparent conductive material. Therefore, the organic light-emitting diode display according to the first example embodiment of the present invention can secure the storage capacitor STG having sufficient capacity since the storage capacitor having a wide area can be formed.

Figure 7H:
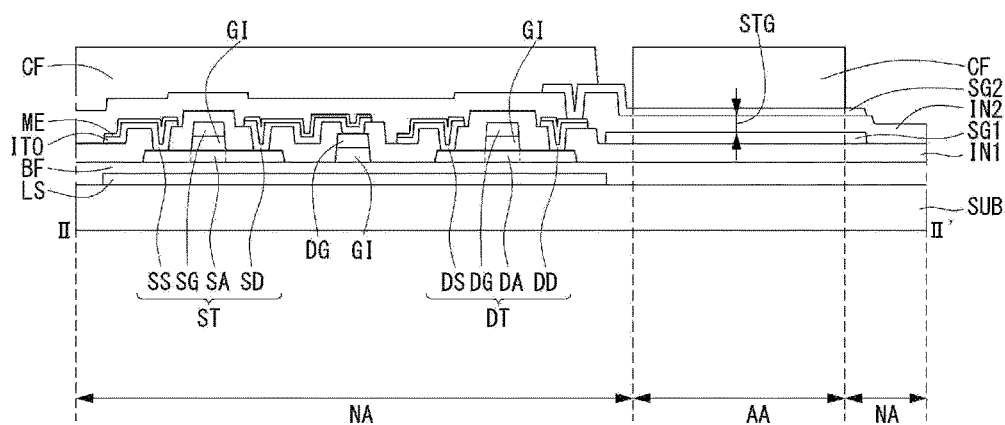

Referring to FIG. 7H, red, green and blue pigments are coated on the overall surface of the substrate SUB on which the second storage capacitor electrode SG2 is formed and sequentially patterned through eighth, ninth and tenth mask processes, respectively, to sequentially form red, green and blue color filters CF. The red, green and blue color filters CF are selectively formed in pixel regions expressing red, green and blue. Here, the red and/or green color filters may be extended and formed to cover the TFTs ST and DT in the pixel regions.

Figure 7I:
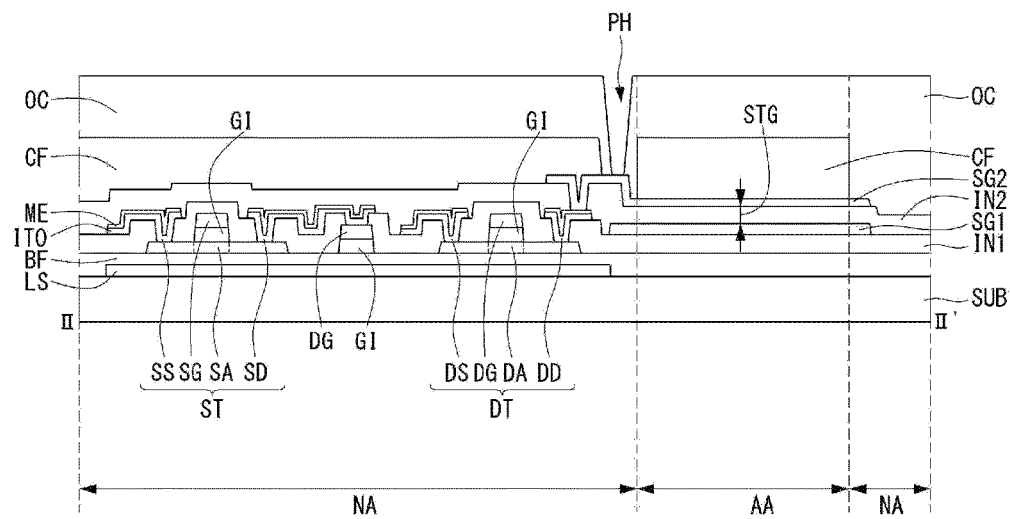

Referring to FIG. 7I, an insulating material is coated on the overall surface of the substrate SUB on which the color filters CF are formed so as to form an overcoat layer OC. The overcoat layer OC is patterned through an eleventh mask process to form a pixel contact hole PH.

Figure 7J:
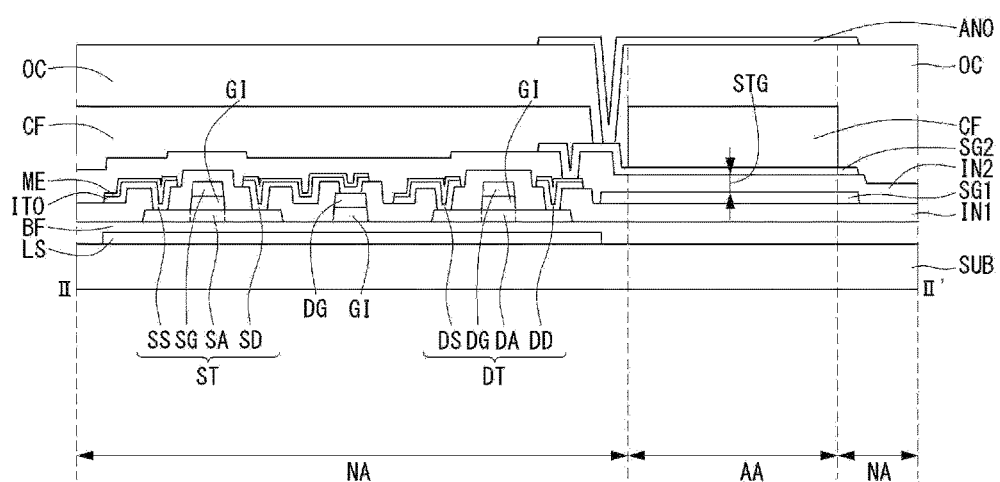

Referring to FIG. 7J, a transparent conductive material is coated on the overall surface of the substrate SUB on which the pixel contact hole PH is formed and patterned through a twelfth mask process to form the anode ANO. The anode ANO comes into contact with the second storage capacitor electrode SG2 via the pixel contact hole PH. In addition, the anode ANO is electrically connected to the drain electrode DD of the driving TFT through the second storage capacitor electrode SG2.

The organic light-emitting diode display according to the first example embodiment of the present invention can secure the storage capacitor STG having sufficient capacity since the first and second storage capacitor electrodes SG1 and SG2 can be formed to have a wide area in the emission area AA without decreasing the aperture ratio. Consequently, the organic light-emitting diode display can sustain pixel data until the next period using charges of the storage capacitor STG when the driving TFT DT is in an off state.

Second Embodiment

Figure 8:
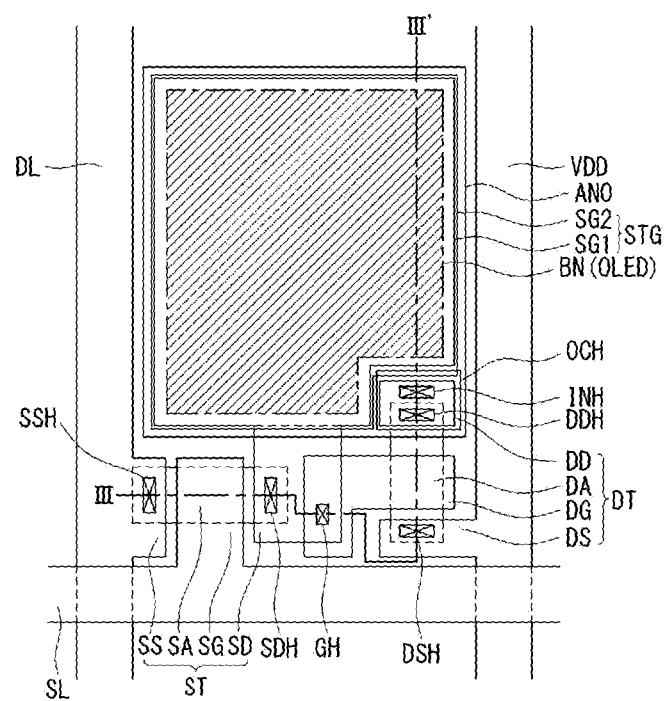
FIG. 8 is a plan view illustrating a structure of an organic light-emitting diode display according to a second example embodiment of the present invention.

A description will be given of an organic light-emitting diode display according to a second example embodiment of the present invention with reference to FIGS. 8 and 9. FIG. 8 is a plan view illustrating a structure of an organic light-emitting diode display according to the second example embodiment of the present invention and FIG. 9 is a cross-sectional view illustrating the structure of the organic light-emitting diode display according to the second example embodiment of the present invention, taken along line III-III' of FIG. 8.

Figure 9:
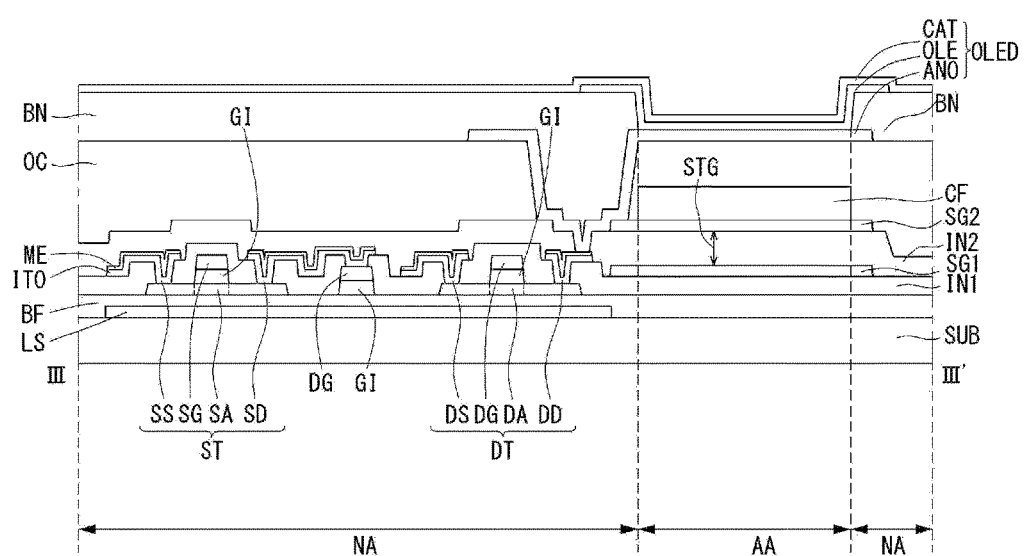
FIG. 9 is a cross-sectional view illustrating the structure of the organic light-emitting diode display according to the second example embodiment of the present invention, taken along line II-II' of FIG. 8.

Referring to FIGS. 8 and 9, the organic light-emitting diode display according to the second example embodiment of the present invention includes a substrate SUB in which an emission area AA and a non-emission area NA are defined, a switching TFT ST, a driving TFT DT connected to the switching TFT ST, a first storage capacitor electrode SG1 connected to the switching TFT ST, a storage capacitor STG formed by the first storage capacitor electrode SG1 and a second storage capacitor electrode SG2 superposed thereon, an anode ANO connected to the driving TFT DT and the second storage capacitor electrode SG2, and an organic light-emitting diode OLED formed by sequentially laminating the anode ANO, an organic emission layer OLE and a cathode CAT. The storage capacitor STG and the organic light-emitting diode OLED are formed in the emission area AA and the TFTs ST and DT or interconnection lines SL, DL and VDD are formed in the non-emission area NA.

Scan lines SL and data lines DL are formed on the substrate SUB in a matrix form so as to define pixels. The switching TFT ST is formed at an intersection of a scan line SL and a data line DL and serves to select a pixel. The switching TFT ST includes a switching gate electrode SG, a channel layer SA, a switching source electrode SS and a switching drain electrode SD. The switching gate electrode SG is branched from the scan line SL and the switching source electrode SS is branched from the data line DL.

The driving TFT DT includes a driving gate electrode DG, a channel layer DA, a driving source electrode DS and a driving drain electrode DD. The driving gate electrode DG is connected to the switching drain electrode SD and the driving source electrode DS is branched from the driving current line VDD.

A passivation layer IN2 is formed to cover the source electrodes SS and DS and the drain electrodes SD and DD of the TFTs ST and DT. The second storage capacitor electrode SG2 is formed on the passivation layer IN2. Here, the second storage capacitor electrode SG2 is superposed on the first storage capacitor electrode SG1, which is formed when the source electrodes SS and DS and the drain electrodes SD and DD of the TFTs ST and DT are formed, having the passivation layer IN2 interposed therebetween so as to form the storage capacitor STG. The first storage capacitor electrode SG1 is connected to the drain electrode SD of the switching TFT ST.

Since the storage capacitor STG is formed in such a manner that the second storage capacitor electrode SG2 formed of a transparent conductive material is superposed on the first storage capacitor electrode SG1 formed of a transparent conductive material, the storage capacitor STG can be formed to have a large area without reducing the aperture ratio in the emission area AA. Accordingly, the organic light-emitting diode display according to the second example embodiment of the present invention can secure a storage capacitor STG having sufficient capacity.

Color filters CF may be formed on the second storage capacitor electrode SG2 in the emission area AA such that the color filters CF respectively correspond to pixel regions. Here, red, green and blue color filters CF may be sequentially arranged and the color filters CF may further include a white color filter CF.

An overcoat layer OC, which exposes part of the drain electrode DD of the driving TFT DT and one side of the second storage capacitor electrode SG2, is formed on the overall surface of the substrate SUB on which the color filters CF are formed. One side of the second storage capacitor electrode SG2 is exposed through an overcoat layer contact hole OCH which penetrates the overcoat layer OC. Part of the driving electrode DD of the driving TFT DT is exposed through a passivation layer contact hole INH which penetrates the overcoat layer OC and the passivation layer IN2. The passivation layer contact hole INH is disposed in the overcoat layer contact hole OCH. The overcoat layer OC is coated on the overall surface of the substrate SUB in order to planarize the surface of the substrate SUB on which the color filters CF are formed.

An anode ANO is formed on the overcoat layer OC to come into contact with the drain electrode DD of the driving TFT DT and one side of the second storage capacitor electrode SG2. Accordingly, the drain electrode DD of the driving TFT DT, the anode ANO and the second storage capacitor electrode SG2 are electrically connected.

A bank BN which exposes part of the anode ANO is formed on the anode ANO. An organic emission layer OLE is formed on the exposed portion of the anode ANO, and a cathode CAT is formed on the organic emission layer OLE to cover the organic emission layer OLE. In this manner, the organic light-emitting diode OLED including the anode ANO, the organic emission layer OLE and the cathode CAT is completed.

A description will be given of a process of manufacturing the organic light-emitting diode display according to the second example embodiment of the present invention with reference to FIGS. 10A to 10J. Characteristics of the organic light-emitting diode display according to the second example embodiment of the present invention are described in more detail through the manufacturing process. FIGS. 10A to 10J are cross-sectional views illustrating a method for manufacturing the organic light-emitting diode display according to the second example embodiment of the present invention.

Figure 10A:
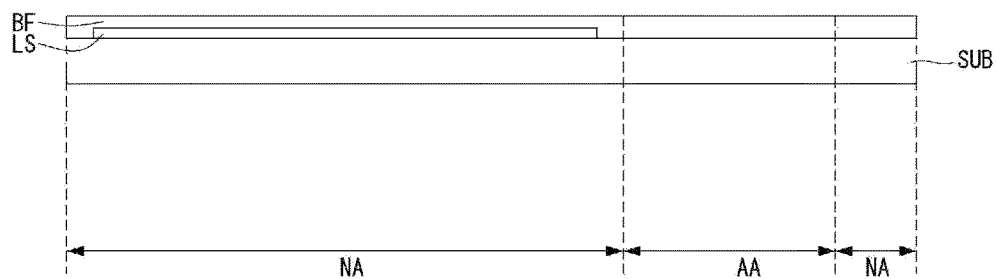
FIGS. 10A to 10J are cross-sectional views illustrating a method for manufacturing the organic light-emitting diode display according to the second example embodiment of the present invention.

Referring to FIG. 10A, an opaque light shielding material is coated on the overall surface of the substrate SUB and patterned through a first mask process to form a light shielding layer LS. It is desirable to form the light shielding layer LS such that semiconductor layers, particularly, channel regions of the TFTs, which will be formed later, are disposed on the light shielding layer LS. The light shielding layer LS serves to protect oxide semiconductor elements from external light. An insulating material is coated on the overall surface of the substrate SUB on which the light shielding layer LS is formed so as to form a buffer layer BF.

Figure 10B:
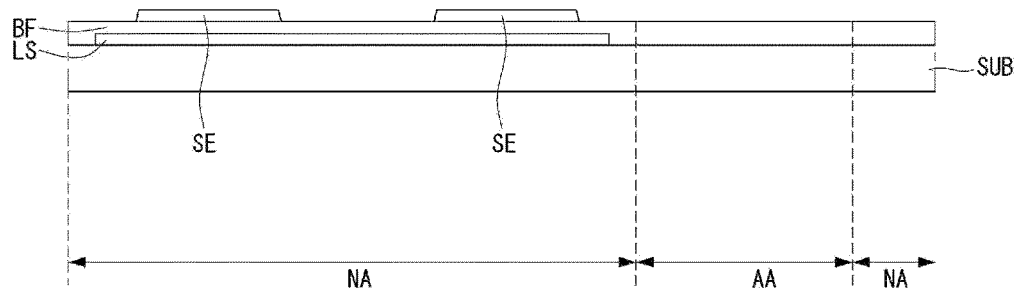

Referring to FIG. 10B, a semiconductor material is coated on the overall surface of the substrate SUB on which the buffer layer BF is formed. The semiconductor material may include an oxide semiconductor material such as indium gallium zinc oxide (IGZO). The semiconductor material layer is patterned through a second mask process to form semiconductor layers SE.

Figure 10C:
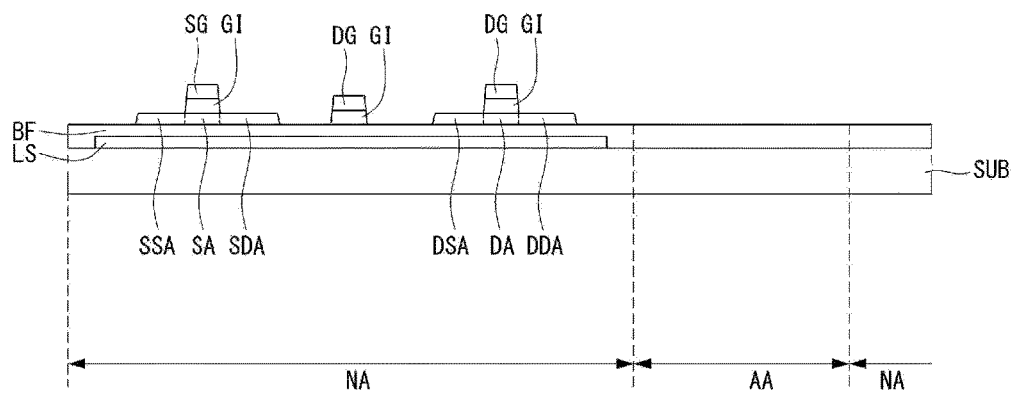

Referring to FIG. 10C, an insulating material and a metal material are sequentially coated on the overall surface of the substrate SUB on which the semiconductor layers SE are formed and simultaneously patterned through a third mask process to form a gate insulating layer GI and the gate electrodes SG and DG superposed thereon. The gate electrodes SG and DG are preferably formed such that the gate electrodes SG and DG are disposed on the center regions of the semiconductor layers SE while exposing both sides of the semiconductor layers SE. The center regions of the semiconductor layers SE are respectively defined as a channel layer SA of the switching TFT and a channel layer DA of the driving TFT. The exposed portions of the semiconductor layers SE become source regions SSA and DSA and drain regions SDA and DDA respectively coming into contact with the source electrodes and the drain electrodes of the switching TFT and the driving TFT. When the semiconductor material is an oxide semiconductor material, the source regions SSA and DSA and the drain regions SDA and DDA may be conductorized through a plasma treatment process.

Figure 10D:
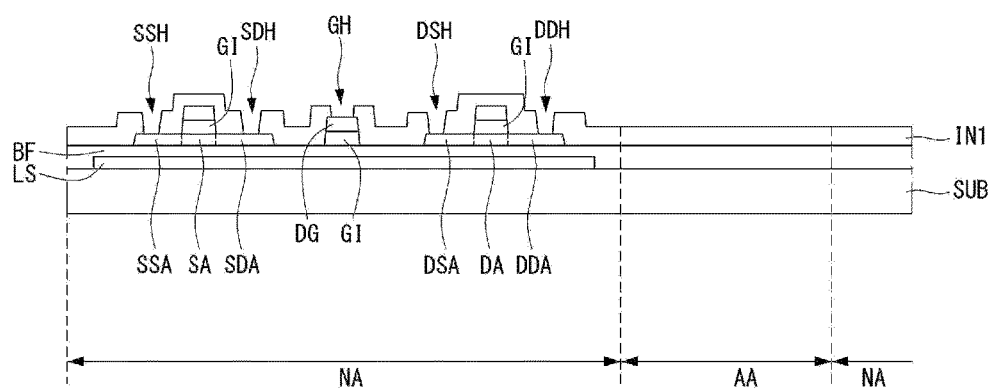

Referring to FIG. 10D, an insulating material is coated on the overall surface of the substrate SUB on which the gate electrodes SG and DG are formed so as to form an interlevel insulating layer IN1. The interlevel insulating layer IN1 is patterned through a fourth mask process to form contact holes SSH and DSH for exposing the source regions SSA and DSA of the semiconductor layers and contact holes SDH and DDH for exposing the drain electrodes SDA and DDA of the semiconductor layers. Here, a gate contact hole GH for exposing part of the gate electrode DG of the driving TFT is simultaneously formed.

Figure 10E:
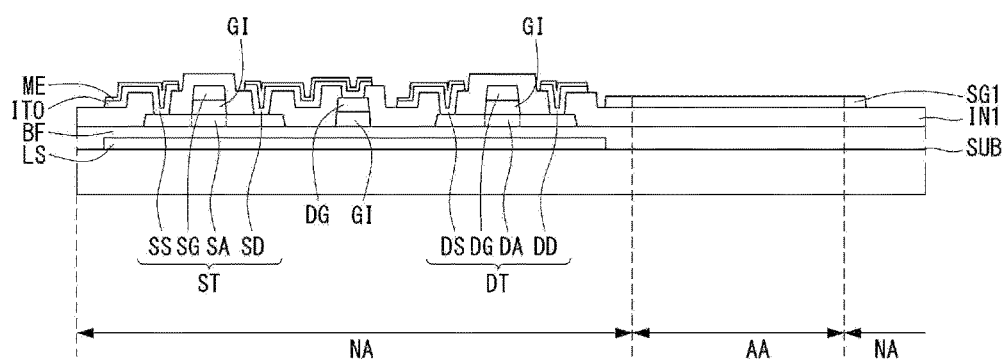

Referring to FIG. 10E, a transparent conductive material and a metal material are sequentially coated on the interlevel insulating layer IN1 in which the contact holes are formed. The transparent conductive material may be indium tin oxide, indium zinc oxide, indium tin zinc oxide or the like. The transparent conductive material layer and the metal material layer are patterned through a fifth mask process to form the source electrode SS and the drain electrode SD of the switching TFT ST and the source electrode DS and the drain electrode DD of the driving TFT DT. The first storage capacitor electrode SG1 is formed of the transparent conductive material in the emission area AA. Here, the first storage capacitor electrode SG1 is electrically connected to the drain electrode SD of the switching TFT. The drain electrode SD of the switching TFT is connected to the gate electrode DG of the driving TFT.

The fifth mask process is performed using a half-tone mask. By using the half-tone mask, the source electrode SS and the drain electrode SD of the switching TFT ST and the source electrode DS and the drain electrode DD of the driving TFT DT are formed of a double layer including the transparent conductor layer ITO and the metal material ME, and the first storage capacitor electrode SG1 is formed of a single layer including only the transparent conductive layer ITO. While the source electrodes SS and DS and the drain electrodes SD and DD of the TFTs ST and DT may be formed of a single layer including only the transparent conductive material ITO, it is desirable that the source electrodes SS and DS and the drain electrodes SD and DD be formed of a double layer including the laminated transparent conductive material ITO and metal material ME, considering that the transparent conductive material ITO has high sheet resistance.

Figure 10F:
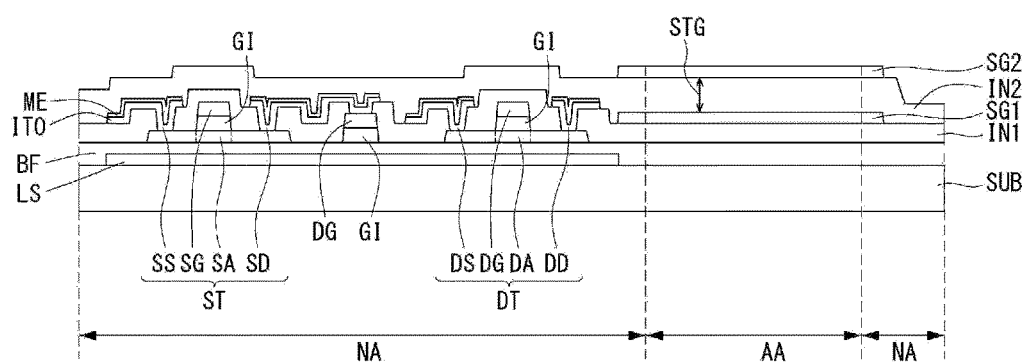

Referring to FIG. 10F, an insulating material is coated on the overall surface of the substrate SUB on which the TFTs ST and DT are formed so as to form a passivation layer IN2. Subsequently, a transparent conductive material is coated on the passivation layer IN2 and patterned through a sixth mask process to form the second storage capacitor electrode SG2. It is desirable to form the second storage capacitor electrode SG2 such that the second storage capacitor electrode SG2 is superposed on the first storage capacitor electrode SG1.

Here, the second storage capacitor electrode SG2 is formed on the first storage capacitor electrode SG1 having the passivation layer IN2 interposed therebetween in the emission area AA so as to form the storage capacitor STG. Accordingly, the first and second storage capacitor electrodes SG1 and SG2 can be formed in the entire emission area AA without decreasing the aperture ratio of the organic light-emitting diode display according to the second example embodiment of the present invention since the first and second storage capacitor electrodes SG1 and SG2 are formed of the transparent conductive material. Therefore, the organic light-emitting diode display according to the second example embodiment of the present invention can secure the storage capacitor STG having sufficient capacity since the storage capacitor STG having a wide area can be formed.

Figure 10G:
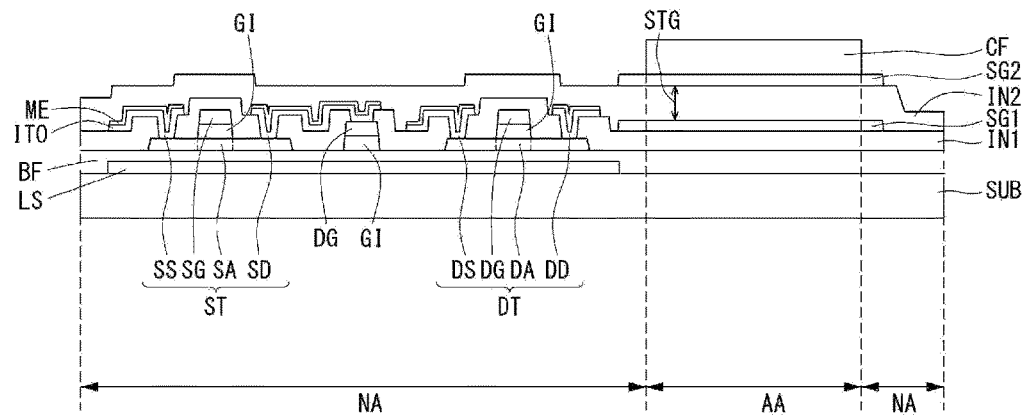

Referring to FIG. 10G, red, green and blue pigments are coated on the overall surface of the substrate SUB on which the second storage capacitor electrode SG2 is formed and sequentially patterned through seventh, eighth and ninth mask processes, respectively, to sequentially form red, green and blue color filters CF. The red, green and blue color filters CF are selectively formed in pixel regions expressing red, green and blue.

Figure 10H:
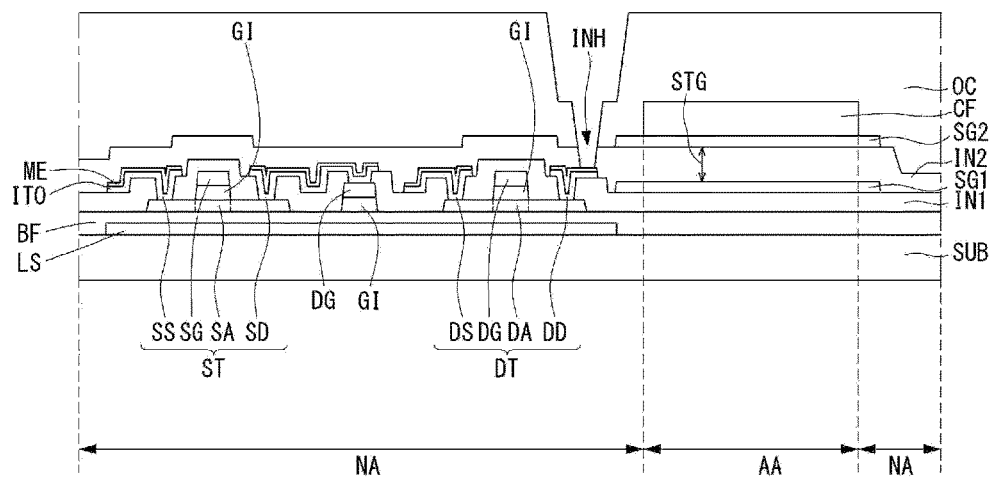
Figure 10I:
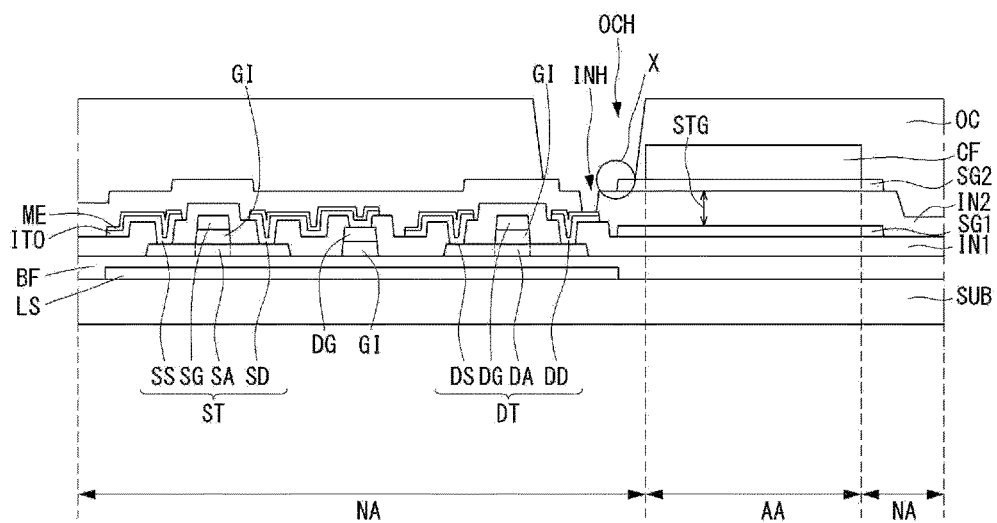

Referring to FIGS. 10H and 10I, a photosensitive insulating material is coated on the overall surface of the substrate SUB on which the color filters CF are formed so as to form an overcoat layer OC. The passivation layer IN2 and the overcoat layer OC are patterned through a tenth mask process to form the passivation layer contact hole INH for exposing the drain electrode DD of the driving TFT DT and the overcoat layer contact hole OCH for exposing one side X of the second storage capacitor electrode SG2.

The tenth mask process is performed using the overcoat layer OC formed of the photosensitive insulating material and a half-tone mask for patterning the overcoat layer OC and the passivation layer IN2. The half-tone mask includes a full-tone area for shielding light projected thereto, a half-tone area for transmitting part of light projected thereto and shielding part thereof, and an area for completely transmitting light projected thereto. The area for completely transmitting light projected thereto in the half-tone mask is disposed on a region in which the passivation layer contact hole INH will be formed, and the half-tone area is disposed on a region in which one side X of the second storage capacitor electrode sG2 will be exposed. The full-tone area of the half-tone mask is disposed on the remaining region. Then, light is selectively projected through the prepared half-tone mask and developing and etching processes are performed so as to form the passivation layer contact hole INH for exposing part of the drain electrode DD of the driving TFT DT (FIG. 10H). Subsequently, asking is performed to remove the overcoat layer OC by a predetermined thickness such that only the overcoat layer OC corresponding to the full-tone area remains. Accordingly, the overcoat layer contact hole OCH which exposes one side X of the second storage capacitor electrode SG2 and the passivation layer contact hole INH is formed (FIG. 10I).

Since the overcoat layer OC contains the photosensitive insulating material, the overcoat layer OC can function as a photoresist during the mask process. The present invention can form the overcoat layer OC, which has the overcoat layer contact hole OCH exposing one side X of the second storage capacitor electrode SG2, and the passivation layer contact hole INH exposing the drain electrode DD of the driving TTF DT through a single mask process using the photosensitive insulating material. While a case in which the aforementioned photosensitive insulating material is a positive type photoresist has been described, the present invention is not limited thereto and the photosensitive insulating layer may be a negative type photoresist.

Figure 10J:
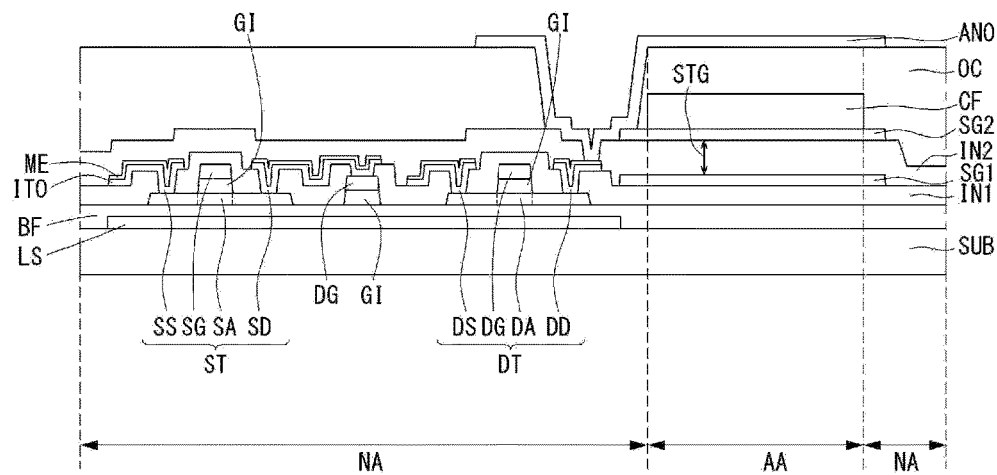

Referring to FIG. 10J, a transparent conductive material is coated on the overall surface of the substrate SUB on which the passivation layer contact hole INH and the overcoat layer contact hole OCH are formed and patterned through an eleventh mask process to form the anode ANO. The anode ANO comes into contact with the drain electrode DD of the driving TFT DT through the passivation layer contact hole INH. In addition, the anode ANO comes into contact with one side of the second storage capacitor electrode SG2. Accordingly, the drain electrode DD of the driving thin film transistor DT, the anode ANO and the second storage capacitor electrode SG2 are electrically connected.

The organic light-emitting diode display according to the second example embodiment of the present invention can secure the storage capacitor STG having sufficient capacity since the first and second storage capacitor electrodes SG1 and SG2 can be formed to have a wide area in the emission area AA without decreasing the aperture ratio. Consequently, the organic light-emitting diode display can sustain pixel data until the next period using charges of the sufficient storage capacitor STG when the driving TFT DT is in an off state.

In addition, the method for manufacturing the organic light-emitting diode display according to the second example embodiment of the present invention reduces the number of mask processes, compared to the first example embodiment. In the second example embodiment of the present invention, the passivation layer IN2 and the overcoat layer OC are patterned using a single mask to form a structure in which the anode ANO directly comes into contact with the drain electrode DD of the driving TFT DT and the second storage capacitor electrode SG2. Accordingly, the second example embodiment can simplify the manufacturing process compared to the first example embodiment.

That is, the organic light-emitting diode display according to the second example embodiment of the present invention has a structure in which the anode ANO directly comes into contact with the drain electrode DD of the driving TFT DT and the second storage capacitor electrode SG2. To manufacture the organic light-emitting diode display having such a structure, the passivation layer contact hole INH (FIG. 10H) for directly connecting the anode ANO and the drain electrode DD of the driving TFT DT and the overcoat layer contact hole OCH (FIG. 10I) for directly connecting the anode ANO and the second storage capacitor electrode SG2 are formed through a single mask process in the second example embodiment of the present invention.

In the first example embodiment of the present invention, the organic light-emitting diode display has a structure in which the drain electrode DD of the driving TFT DT and the second storage capacitor electrode SG2 are directly connected and the anode ANO directly comes into contact with the second storage capacitor electrode SG2. To manufacture the organic light-emitting diode display having such a structure, it is necessary to perform two mask processes, that is, a process for forming the storage capacitor contact hole SGH (FIG. 7E) through which the drain electrode DD of the driving TFT DT directly comes into contact with the second storage capacitor electrode SG2 and a process for forming the pixel contact hole PH (FIG. 7G) through which the second storage capacitor electrode SG2 directly comes into contact with the anode ANO.

Therefore, the method for manufacturing the organic light-emitting diode display according to the second example embodiment of the present invention can reduce the number of mask processes, compared to the first example embodiment, thereby simplifying the manufacturing process and decreasing manufacturing time and manufacturing costs. In addition, it is possible to reduce a defect generation rate in the manufacturing process, improving production yield.

In accordance with the foregoing, embodiments of the present invention relate to an organic light-emitting diode display having an aperture ratio improved by forming a storage capacitor in an emission area using a transparent conductive material and a method for manufacturing the same. In addition, embodiments of the present invention relate to an organic light-emitting diode display and a method for manufacturing the same for simplifying a manufacturing process by reducing the number of mask processes.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:
1. An organic light-emitting diode display, comprising:
   a substrate in which an emission area and a non-emission area are defined;
   a thin film transistor disposed in the non-emission area on the substrate;
   a passivation layer disposed on the thin film transistor;
   a first storage capacitor electrode and a second storage capacitor electrode superposed thereon, having the passivation layer interposed therebetween, in the emission area;
   an overcoat layer disposed on the second storage capacitor electrode; and
   an anode, disposed on the overcoat layer, coming into contact with one side of the second storage capacitor electrode through an overcoat layer contact hole penetrating the overcoat layer, and coming into contact with a part of the thin film transistor through a passivation layer contact hole disposed in the overcoat layer contact hole and penetrating the passivation layer,
   wherein the overcoat layer contact hole simultaneously exposes the passivation layer contact hole, one side of the second storage capacitor electrode and the part of the thin film transistor,
   wherein one side of the second storage capacitor electrode and the part of the thin film transistor directly contact the anode, respectively, and wherein the second storage capacitor electrode and the part of the thin film transistor are spaced apart from each other and electrically connected through the anode.

2. The organic light-emitting diode display of claim 1, wherein the first and second storage capacitor electrodes contain a transparent conductive material.

3. The organic light-emitting diode display of claim 1, wherein the overcoat layer contains a photosensitive insulating material.

4. The organic light-emitting diode display of claim 1, further comprising a color filter disposed on the second storage capacitor electrode in the emission area.

5. The organic light-emitting diode display of claim 1, further comprising:
a bank disposed on the anode to expose a part of the anode;
an organic emission layer disposed on the exposed portion of the anode; and
a cathode disposed on the organic emission layer to cover the organic emission layer,
wherein the part of the anode exposed by the bank is the emission area.

6. An organic light-emitting diode display, comprising:
a substrate in which an emission area and a non-emission area are defined, a thin film transistor disposed in the non-emission area, a storage capacitor and an organic light emitting diode disposed in the emission area,
wherein the thin film transistor comprises:
a semiconductor layer disposed on the substrate;
a gate electrode superposed on the semiconductor layer, having a gate insulating layer interposed therebetween; and
a source electrode and a drain electrode disposed on an interlevel insulating layer covering the gate electrode, coming into contact with one side and the other side of the semiconductor layer through a source contact hole and a drain contact hole penetrating the interlevel insulating layer, respectively;
wherein the storage capacitor comprises:
a first storage capacitor electrode disposed on the interlevel insulating layer; and
a second storage capacitor electrode superposed on the first storage capacitor electrode, having a passivation layer interposed therebetween,
wherein the organic light emitting diode comprises:
an anode disposed on an overcoat layer to cover the second storage capacitor electrode, coming into contact with the drain electrode and the second storage capacitor electrode through a contact hole penetrating the passivation layer and the overcoat layer;
an organic emission layer disposed on a portion of the anode exposed by a bank which is disposed on the anode; and
a cathode disposed on the organic emission layer to cover the organic emission layer,
wherein the contact hole simultaneously exposes both a part of the drain electrode and one side of the second storage capacitor electrode,
wherein the part of the drain electrode and one side of the second storage capacitor electrode directly contact the anode, respectively, and
wherein the part of the drain electrode and one side of the second storage capacitor electrode are spaced apart from each other and electrically connected through the anode.

7. The organic light-emitting diode display of claim 6, wherein the contact hole includes:
an overcoat layer contact hole which penetrates the overcoat layer to expose one side of the second storage capacitor electrode; and
a passivation layer contact hole which penetrates the passivation layer to expose the part of the drain electrode,
wherein the passivation layer contact hole is disposed in the overcoat layer contact hole.

8. The organic light-emitting diode display of claim 6, wherein the source electrode and the drain electrode are a double layer laminating a transparent conductive material and a metal material, and
wherein the first storage capacitor electrode is a single layer including the transparent conductive material.

9. An organic light-emitting diode display comprising:
a substrate in which an emission area and a non-emission area are defined,
a thin film transistor disposed in the non-emission area,
a storage capacitor disposed in the emission area, having a first storage capacitor electrode and a second storage capacitor electrode superposed on the first storage capacitor electrode, having a passivation layer interposed therebetween; and
an anode coming into contact with the thin film transistor and the second storage capacitor electrode through a contact hole penetrating at least one insulating layer disposed therebetween,
wherein the contact hole simultaneously exposes both a part of the thin film transistor and one side of the second storage capacitor electrode,
wherein the part of the thin film transistor and one side of the second storage capacitor electrode directly contact the anode, respectively, and
wherein the part of the thin film transistor and one side of the second storage capacitor electrode are spaced apart from each other and electrically connected through the anode.

10. The organic light-emitting diode display of claim 9, wherein the at least one insulating layer through which the contact hole penetrates includes the passivation layer and an overcoat layer disposed on the passivation layer,
wherein the contact hole includes:
an overcoat layer contact hole which penetrates the overcoat layer to expose one side of the second storage capacitor electrode; and
a passivation layer contact hole which penetrates the passivation layer to expose the part of the thin film transistor, and
wherein the passivation layer contact hole is disposed in the overcoat layer contact hole.

11. The organic light-emitting diode display of claim 9, further comprising:
a bank disposed on the anode to expose part of the anode;
an organic emission layer disposed on the exposed portion of the anode; and
a cathode disposed on the organic emission layer to cover the organic emission layer,
wherein the part of the anode exposed by the bank, is the emission area.

* * * * *